United States Patent
Lee (10) Patent No.: US 7,130,188 B2
(45) Date of Patent: Oct. 31, 2006

(54) LOCKING APPARATUS AND METHOD BETWEEN PORTABLE TERMINAL AND CRADLE FOR TERMINAL

(75) Inventor: Kwang-youb Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 176 days.

(21) Appl. No.: 10/756,384

(22) Filed: Jan. 14, 2004

(65) Prior Publication Data

US 2004/0145871 A1 Jul. 29, 2004

(30) Foreign Application Priority Data

Jan. 24, 2003 (KR) .................... 10-2003-0004910

(51) Int. Cl.
*H05K 5/00* (2006.01)
*H05K 7/00* (2006.01)

(52) U.S. Cl. .................................... 361/686

(58) Field of Classification Search ............... 340/5.5; 726/19, 21, 34, 35, 16, 17; 713/182, 200, 713/202; 361/686, 732; 439/133; 335/290; 318/126, 127, 128; 310/17; 292/57, 144, 292/201, 304
See application file for complete search history.

(56) References Cited

U.S. PATENT DOCUMENTS

| | | | |
|---|---|---|---|
| 4,012,063 A * | 3/1977 | Sherlock et al. ............... 292/57 |
| 4,369,481 A * | 1/1983 | Early ........................ 361/173 |
| RE33,873 E * | 4/1992 | Ramano ...................... 340/543 |
| 5,323,291 A * | 6/1994 | Boyle et al. ................. 361/686 |
| 5,660,065 A * | 8/1997 | Edlund ......................... 70/58 |
| 5,911,777 A * | 6/1999 | Heredia ...................... 713/200 |
| 5,959,287 A * | 9/1999 | Myers et al. .......... 235/472.02 |
| 5,997,054 A * | 12/1999 | Baudu et al. ............... 292/201 |
| 6,151,218 A * | 11/2000 | Pirdy et al. ................. 361/727 |
| 6,564,600 B1* | 5/2003 | Davis .......................... 70/277 |
| 6,716,058 B1* | 4/2004 | Youn .......................... 439/535 |
| 6,864,798 B1* | 3/2005 | Janik ..................... 340/693.11 |
| 6,882,866 B1* | 4/2005 | Sato ........................ 455/556.2 |
| 6,928,557 B1* | 8/2005 | Inoue et al. ............. 360/99.06 |
| 2002/0158130 A1* | 10/2002 | Pellaumail et al. .... 235/462.13 |

FOREIGN PATENT DOCUMENTS

GB 2024922 A * 1/1980

* cited by examiner

*Primary Examiner*—Lynn Feild
*Assistant Examiner*—Ingrid Wright
(74) *Attorney, Agent, or Firm*—Staas & Halsey LLP (57) ABSTRACT

A locking apparatus including a portable terminal having a terminal control section and a bottom plate, wherein the bottom plate includes a first connection terminal connected to the terminal control section and a locking hole; and a cradle having a seating portion, on which the portable terminal is seated, a cradle control section, a second connection terminal located in a position corresponding to the first connection terminal and connected to the cradle control section, and a locking member located in the seating portion in a position corresponding to the locking hole, wherein the locking member is inserted into the locking hole and rotates based on locking member rotation information.

33 Claims, 7 Drawing Sheets

LOCKING APPARATUS AND METHOD BETWEEN PORTABLE TERMINAL AND CRADLE FOR TERMINAL

CROSS-REFERENCE TO RELATED APPLICATIONS

This application claims the benefit of Korean Application No. 2003-04910, filed Jan. 24, 2003, in the Korean Intellectual Property Office, the disclosure of which is incorporated herein by reference.

BACKGROUND OF THE INVENTION

1. Field of the Invention

The present invention relates to a locking apparatus and a locking method between a portable terminal and a cradle for the portable terminal, and in particular, to a locking apparatus and a locking method between a portable terminal and a cradle for the portable terminal, by which the portable terminal can be prevented from being stolen or separated from the cradle when the portable terminal is seated on the cradle for storage or charging.

2. Description of the Related Art

Through the advancement of electron and telecommunication technology, various types of terminals have been developed for processing data. In particular, portable terminals, which allow limitations in usable area to be overcome, establish a new domain, as a result of which various technologies and products have appeared.

Figure 1:
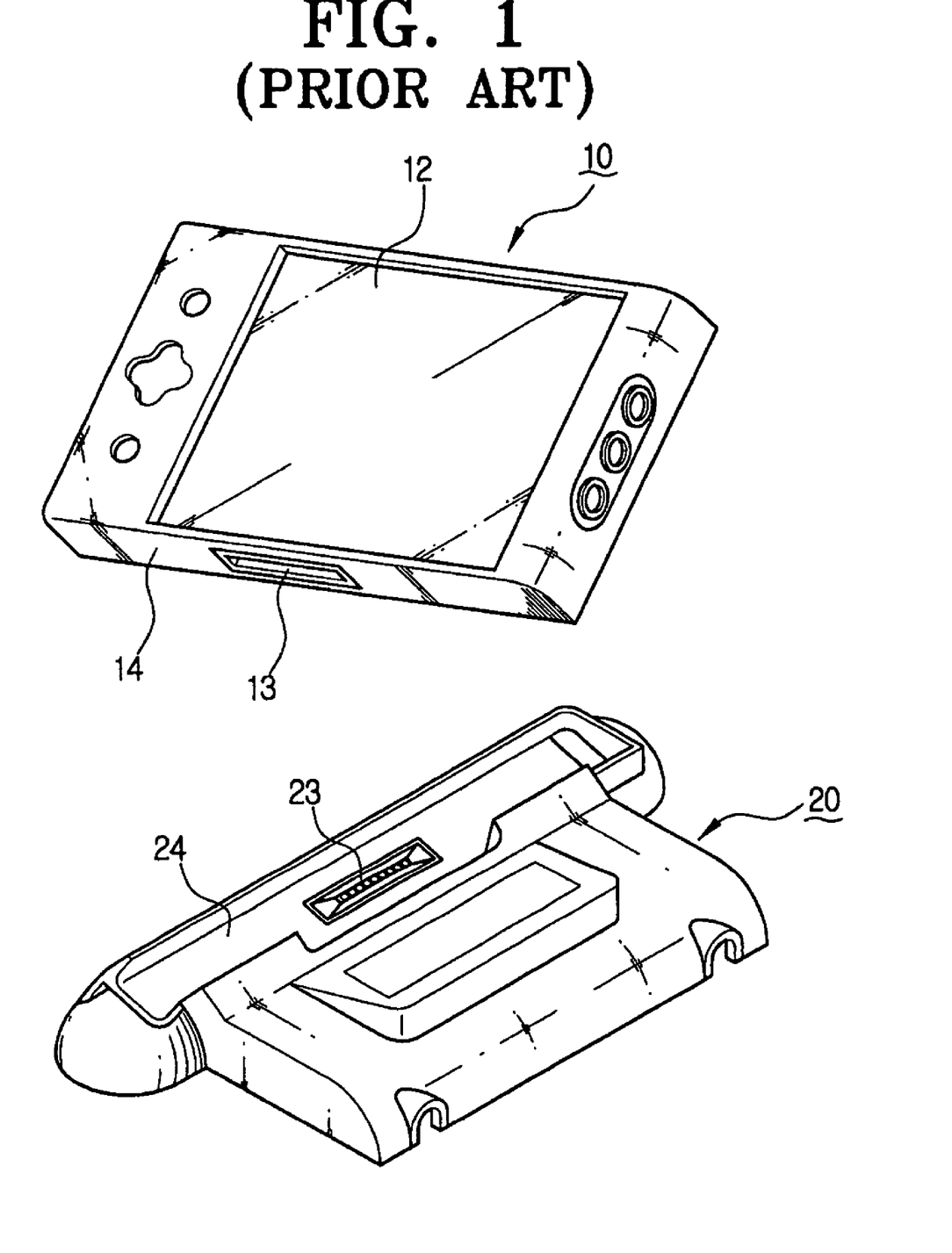
FIG. 1 is a perspective view of a conventional a portable terminal and a cradle.

As shown in FIG. 1, a portable terminal 10 generally holds a seating device called a cradle 20. The portable terminal 10 is seated on a seating portion 24 formed in the cradle 20 at the time when a user does not use the portable terminal, or in order that the portable terminal may be charged with electricity or may be connected to a main computer (not shown) for receiving or transmitting various data.

In general, the cradle 20 for such a portable terminal may take various shapes according to the portable terminal 10 for mobile use, and may be installed within an automobile or a room and then connected to an external power source or a main computer.

However, most often the related art cradle 20 for the portable terminal 10 merely comprises a seating portion 24, on which the portable terminal 10 is seated, and a connection terminal 23 that is provided in a side within the seating portion 24, wherein the connection terminal 23 is connectable to a connection terminal 13 that is provided in a side of the portable terminal, and the connection terminals 13 and 23 are used for charging the portable terminal 10 with electricity and/or for connecting the portable terminal 10 to a main computer connected with the cradle 20. Such a construction includes a problem in security related to the portable terminal 10 such as a PDA (Personal Digital Assistant) adapted to process and store various data due to miniaturization of computers according to the advancement of electronic technology. That is, because various information is recorded in the portable terminal with data processing and storage capability, there is a risk of information leakage when the portable terminal is stolen. In particular, considering that the portable terminal 10 is sometimes used outdoors and the cradle 20 is sometimes installed within an automobile, such a security problem occupies a very important position.

Furthermore, because the portable terminal 10 itself is very expensive, the loss of the portable terminal may impose an economic burden on the user.

SUMMARY OF THE INVENTION

Accordingly, the present invention has been made to solve the above and/or other problems occurring in the related art, and an aspect of the present invention provides a locking apparatus and a locking method between a portable terminal and a cradle, which the portable terminal can be prevented from being stolen even if the portable terminal is seated on the cradle, whereby it is possible to forbid a person to maliciously use the portable terminal.

Another aspect of the present invention provides a locking apparatus and a locking method between a portable terminal and a cradle, which the portable terminal can be prevented from being separated from the cradle when an automobile installed with the cradle is shocked and/or vibrated.

In order to achieve the above and/or other aspects, there is provided a locking apparatus comprising: a portable terminal comprising a terminal control section, a first connection terminal provided in a side of a bottom plate and connected with the terminal control section, and a locking hole formed in the other side of the bottom plate; and a cradle comprising a seating portion, on which the portable terminal is seated, a cradle control section, a second connection terminal located in a position corresponding to the first connection terminal and connected to the cradle control section, and a locking member located in the seating portion in a position corresponding to the locking hole. The locking member is inserted into the locking hole and rotates on the basis of locking member rotation information that is rotation request information of the locking member.

When it is requested that the locking member and the locking hole be locked together, the locking member rotation information is created in response to the connection of the first and second connection terminals after the portable terminal is seated on the seating portion.

The portable terminal further comprises an input part, and the locking member rotation information is created in response to a password inputted through the input part when it is requested that the locking between the locking member and the locking hole be released.

The cradle further comprises a rotary motor controlled through the cradle control section and connected to the locking member. The rotary motor is controlled to rotate when a recognition signal for the locking member rotation information is inputted into the cradle control section.

The first connection terminal comprises a first control section connection terminal connected to the terminal control section, and the second connection terminal comprises a second control section connection terminal corresponding to the first control section connection terminal and connected to the cradle control section. The recognition signal is the signal transmitted from the terminal control section to the cradle control section through the first and second control section connection terminals as the first and second control section connection terminals are interconnected when the portable terminal is seated on the seating portion.

The first connection terminal comprises a first control section connection terminal connected to the terminal control section, and the second connection terminal comprises a second control section connection terminal corresponding to the first control section connection terminal and connected to the cradle control section. The recognition signal is the signal transmitted from the terminal control section to the cradle control section through the first and second control section connection terminals when a password is inputted into the input part.

The rotary motor is controlled to stop the rotation of the locking member when a rotary motor control signal is inputted through the cradle control section.

The portable terminal further comprises a light transmission/reception hole formed in a predetermined area in the bottom plate, and the cradle. The cradle further comprises a light transmission/reception port for emitting light and a reflection plate. The light transmission/reception port is provide in such a position that the emitted light is reflected from the locking member through the light transmission hole and is controlled by the cradle controller. The reflection plate reflects the light to the bottom surface of the locking member. When a predetermined amount of light reflected from the reflection plate is received in the light transmission/reception port, the rotary motor control signal is produced in the cradle control section on the basis of the amount of reflected light.

When the locking member rotation information is created in response to the connection of the first and second connection terminals, the amount of reflected light does not exceed the predetermined amount.

Alternatively, when the locking member rotation information is created in response to the password inputted through the input part, the amount of reflected light exceeds the predetermined amount.

The cradle further comprises a polarity switching terminal connected to the rotary motor for switching the polarities of the electric power applied to the rotary motor, wherein the polarity switching terminal is controlled through the cradle control section, and wherein the polarity switching terminal switches the polarities in such a way that the rotary motor rotates in a given direction when a recognition signal for recognizing the connection of the first and second connection terminals is inputted through the cradle control section, and the rotary motor rotates in a direction opposite to the given direction when a recognition signal for recognizing the inputting of the password is inputted.

In order to achieve the above and/or other objects, there is also provided a locking method based on a portable terminal and a cradle, wherein the portable terminal comprises a terminal control section, a first connection terminal provided in a side of a bottom plate and connected with the terminal control section, and a locking hole formed in the other side of the bottom plate, and the cradle comprises a seating portion, on which the portable terminal is seated, a cradle control section, a second connection terminal located in a position corresponding to the first connection terminal and connected to the cradle control section, a locking member located in the seating portion in a position corresponding to the locking hole, and rotary motor connected to the locking member to rotate the locking member. The method comprises: creating locking member rotation information that is rotation request information of the locking member; transmitting a recognition signal, in which the terminal control section recognizes the locking member rotation information and transmits the recognition signal to the cradle control section; outputting a control signal for controlling the rotary motor, in which the cradle control section outputs the control signal on the basis of the recognition signal; and driving the rotary motor with the control signal and hence rotating the locking member.

According to the present invention, it is possible to prevent a portable terminal from being stolen or separated from a cradle.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages, features and advantages of the invention will become apparent and more readily appreciated from the following description of the embodiment taken in conjunction with the accompanying drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to the like elements throughout. The embodiments are described below to explain the present invention by referring to the figures.

Hereinbelow, the preferred embodiments will be described in detail with reference to FIGS. 2 to 4.

Figure 2:
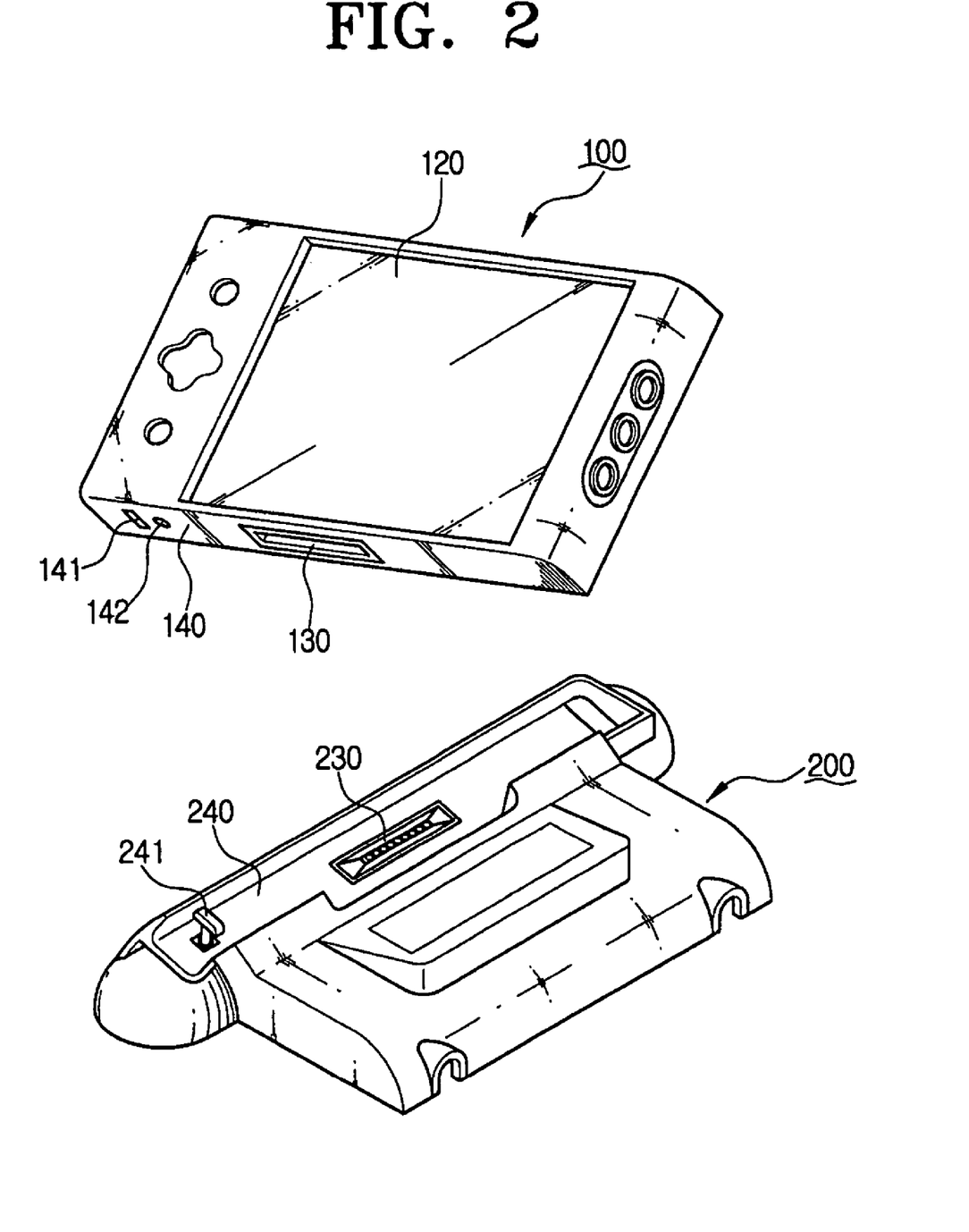
FIG. 2 is a perspective view of a portable terminal and a cradle according to an embodiment of the present invention.

FIG. 2 is a perspective view showing a portable terminal and a cradle according to the present invention. A portable terminal 100 and a cradle 200 according to an embodiment of the present invention are constructed as shown in FIG. 2.

The portable terminal 100 is provided with a display screen 120 in its front face so as to display various data information or an input by a user. It is preferable that the display screen 120 is a TSP (Touch Screen Panel).

In this specification, description will be made assuming that the display screen 120 is a TSP and thus it also has a function as an input part.

The portable terminal 100 is also provided with a bottom plate 140 on its bottom side. The bottom plate 140 contains a locking hole 141 and a first connection terminal 130.

The cradle 200, on which the portable terminal is seated, is provided with a seating portion 240 on the topside thereof to be engaged with the bottom plate 140 of the portable terminal 100. In addition, the seating portion 240 is provided with a locking member 241 at one side thereof to be inserted into the locking hole 141 in the portable terminal 100, and with a second connection terminal 230 at the other side to be connected with the first connection terminal 130 of the portable terminal 100, the locking member 241 and the second connection terminal 230 being positioned to correspond to the locking hole 141 and the first connection terminal 230, respectively.

The locking member 241 may take various shapes according to the locking hole 141. However, it is preferable that the locking member 241 take a "1" shape and the locking hole 141 take a form of a bore.

Although only one locking member 241 is provided in this embodiment, the present invention is not limited thereto. A plurality of locking members with a corresponding number of locking holes may be provided.

Figure 3:
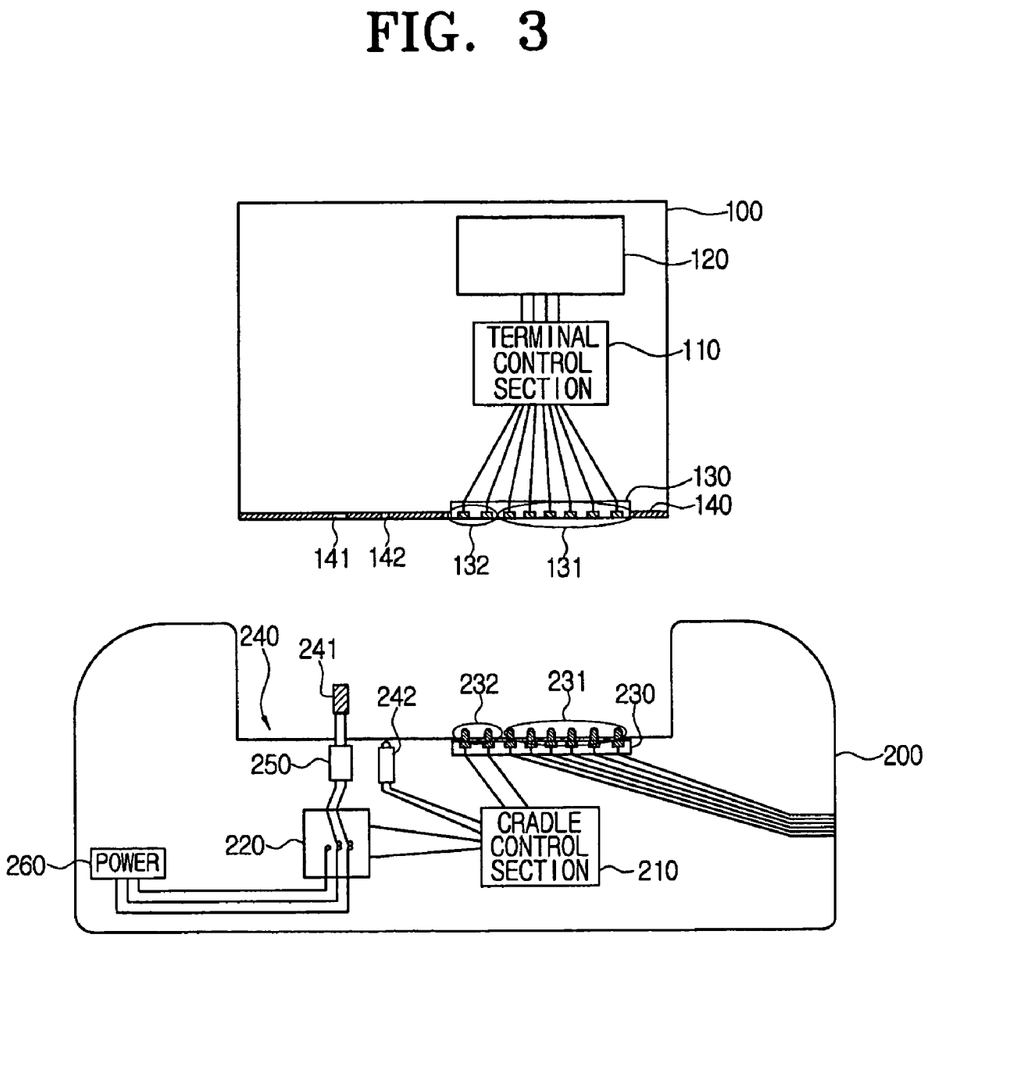
FIG. 3 is a schematic cross-sectional view showing the internal constructions of the portable terminal and the cradle.

FIG. 3 is a schematic cross-sectional view showing the internal constructions of the portable terminal and the cradle according to an embodiment of the present invention.

The portable terminal 100 comprises a terminal control section 110, a display screen 120, and the bottom plate 140.

The terminal control section 110 receives one or more signals from an operation device, an input/output device, a memory device, etc., and then executes extraction or deciphering of a command, control of input or output, etc.

The terminal control section 110 recognizes first locking member rotation information created in response to the connection of the first and second connection terminals 130 and 230 and then transmits a first recognition signal to a cradle control section 210 installed within the cradle 200 via the first and second connection terminals 130 and 230.

In addition, when a password is inputted through the display screen 120 for releasing the locking between the portable terminal 100 and the cradle 200, the terminal control section 110 determines if the password is correct. If it is determined that the password is correct, the terminal control section 110 transmits a second recognition signal to the cradle control section 210 of the cradle 200 based on the second locking member rotation information created in response to the password.

The bottom plate 140 comprises a light transmission/reception hole 142 as well as the first connection terminal 130 and the locking hole 141.

The first connection terminal 130, which is installed on a side of the bottom plate 140, comprises a first serial connection terminal 131 and a first control section connection terminal 132.

The first serial connection terminal 131 serves as a passage for transmitting data information and one or more signals processed in the terminal control section 110 to a computer (not shown) connected to the cradle 200.

The control section connection terminal 132 serves as a passage for transmitting the first and second recognition signals outputted from the terminal control section 110 when the first and second connection terminals 130 and 230 are connected with each other or a correct password is inputted into the display screen 120.

The locking hole 141 is provided in a position corresponding to the locking member 241, so that the locking member 241 is inserted into the locking hole 141. The locking hole 141 may take various shapes according to the shape of the locking member 241.

A light transmission/reception hole 142 is a passage for passing infrared ray emitted from a light transmission/reception port 242 into the interior of the portable terminal 100. The light transmission/reception hole 142 is positioned to correspond to the light transmission/reception port 242. Herein, although the description is made assuming that the light emitted from the light transmission/reception port 242 is an infrared ray, the present invention is not limited thereto.

The cradle 200 according to the present invention comprises a polarity-switching terminal 220, a rotary motor 250, a power supply 260, a cradle control section 210, and a light transmission/reception port 242.

The cradle control section 210 receives one or more signals from an operational device, an input/output device, a memory device, etc., and executes extraction or deciphering of a command, control of input or output, etc.

In the present invention, when it is intended to interlock the portable terminal 100 and the cradle 200, the cradle control section 210 receives the first recognition signal transmitted from the terminal control section 110 when the terminal control section 110 recognizes the connection of the first and second connection terminals 130 and 230. The cradle control section 210 then outputs a first control signal to drive the rotary motor 250 and concurrently outputs a second control signal in order for the infrared ray to be outputted from the light transmission/reception port 242. And, when it is recognized that the reflected amount of the infrared ray emitted from the light transmission/reception port 242 and reflected from a reflection plate 243 is below a predetermined value, the cradle control section 210 is inputted with the first signal transmitted from the light transmission/reception port 242 and outputs a third control signal for stopping the driving of the rotary motor 250.

In addition, in order to release the locking between the portable terminal 100 and the cradle 200, the cradle control section 210 receives the second recognition signal transmitted from the terminal control section 110 when the terminal control section 110 recognizes that a correct password is inputted into the display screen 120 and outputs a first signal to drive the rotary motor 250 and concurrently outputs a second control signal in order for the infrared ray to be outputted from the light transmission/reception port 242. When the reflected amount of infrared ray emitted from the light transmission/reception port 242 and reflected from the reflection plate 243 exceeds a predetermined value, the cradle control section 210 is inputted with the second signal transmitted from the light transmission/reception 242 and outputs a fourth control signal to stop the driving of the rotary motor 250.

A polarity switching terminal 220 is located between the power supply 260 and the rotary motor 250 and switches the polarities of the electric power supplied to the rotary motor 250. If the electric power has one polarity, the locking member 241 rotates in a given direction. If the electric power has the other polarity, the locking member 241 rotates in the opposite direction to the given direction.

The light transmission/reception port 242 is located in a position corresponding to the reflection plate 243 of the locking member 241. The light transmission/reception port 242 receives the second control signal and emits infrared ray through the light transmission/reception hole 142. The second control signal is outputted simultaneously when the first control signal is outputted for driving the rotary motor 250 as the first and second recognition signals are inputted into the cradle control section 210. The emitted infrared ray is reflected from a position within the reach of the reflection plate 243. However, the emitted infrared ray is not reflected from a position beyond the reach of the reflection plate 243.

The rotary motor 250 rotates the locking member 241 connected to the top thereof. The rotary motor 250 is connected to the power supply 260 and driven by electric power supplied from the power supply 260.

The power supply 260 is controlled by the cradle control section 210 to supply electric power for driving the rotary motor 250.

In addition, the cradle 200 contains a seating portion 240 on the topside thereof, on which the portable terminal 100 is seated. The seating portion 240 contains the locking member 241 in one side thereof and a second connection terminal 230 in the other side.

The second connection terminal 230 provided on the other side of the seating portion 240 comprises a second serial connection terminal 231 and a second control section connection terminal 232.

The second serial connection terminal 231 is connected to a first serial connection terminal 131 and serves as a passage for transmitting data information and one or more signals processed in the terminal control section 110 to a main computer (not shown) connected to the cradle 200.

The second control section connection terminal 232 is connected to the first control section connection terminal 132 and serves as a passage for transmitting the first and second recognition signals as mentioned above from the terminal control section 110 to the cradle control section 210.

Although the first connection terminal 131 is illustrated as a female terminal and the second connection terminal 231 is illustrated as a male terminal, the present invention is not limited thereto.

The locking member 241 is inserted into the locking hole 141 when the portable terminal 100 and the cradle 200 are coupled. The locking member 241 is connected to the rotary motor 250 at its bottom side and driven by the rotary motor 250, thereby being locked with the locking hole 141. The reflection plate 243 is located on the bottom of the locking member 241 and reflects the infrared ray emitted from the light transmission/reception port 242.

Figure 4A:
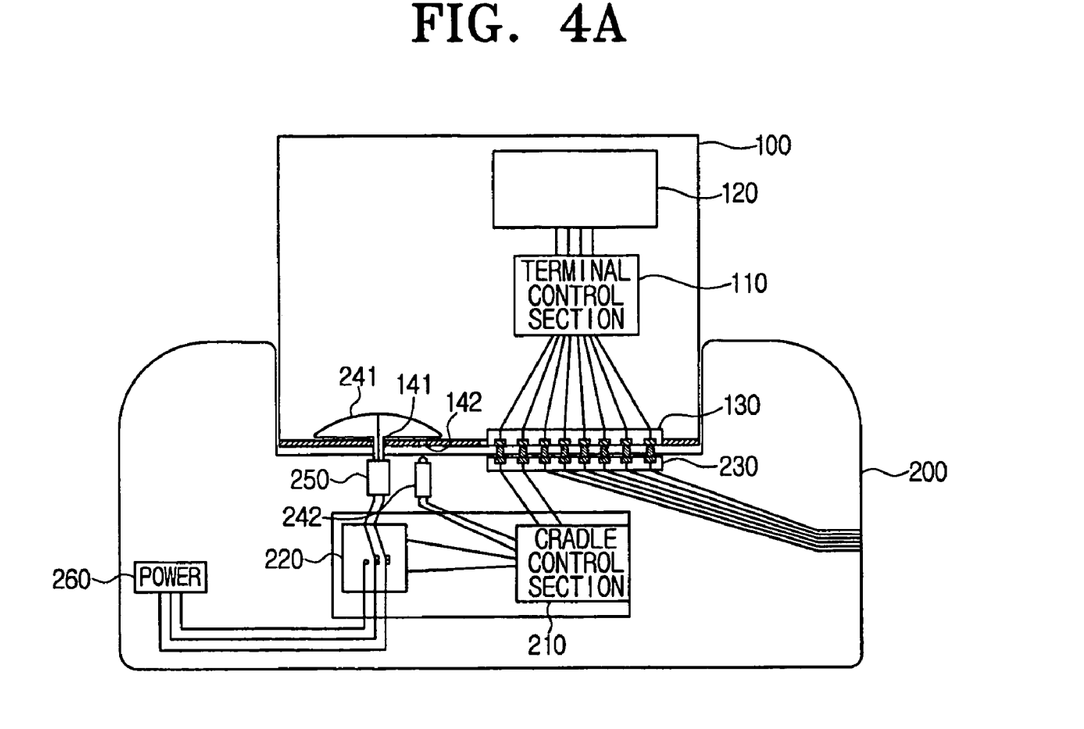
FIG. 4A is a schematic cross-sectional view of a state in which the portable terminal and the cradle are locked each other

FIG. 4A shows a state, in which the portable terminal and the cradle according to an embodiment of the present invention are locked each other.

Using the first locking member rotation information created in response to the connection between the first and second connection terminals 130 and 230, the first recognition signal of the terminal control section 110 is transferred to the cradle control section 210. The first and second control signals are outputted to the rotary motor 250 and the light transmission/reception port 242, respectively, from the cradle control section 210, thereby rotating the locking member 241 and concurrently projecting the infrared ray, which a time to stop the rotation of the locking member 241 is determined.

Figure 4B:
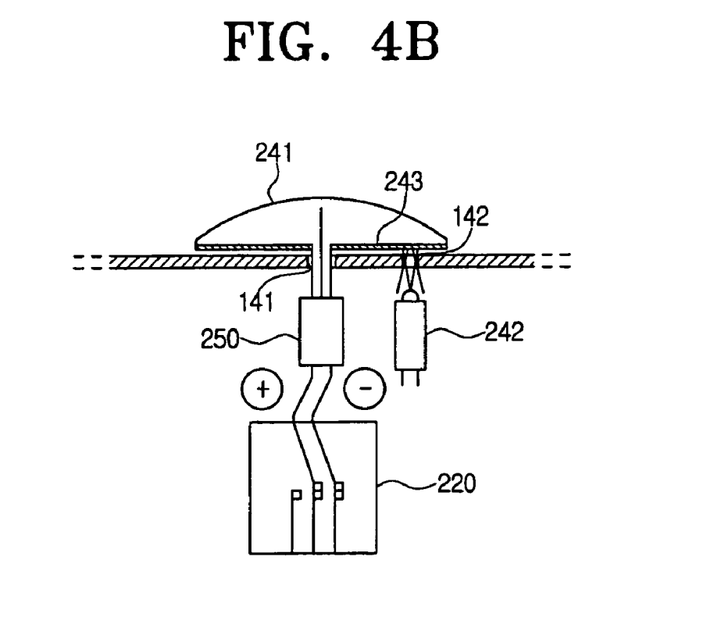
FIG. 4B is an enlarged view of a portion of FIG. 4a, illustrating the locked state, the emission of infrared ray, and a polarity-switching terminal.

FIG. 4B is an enlarged view of a part of FIG. 4A, wherein the infrared ray emitted from the light transmission/reception port 242 is reflected from the reflection plate 243. If the infrared ray emitted from the light transmission/reception port 242 is reflected from the reflection plate 243 and thus more than a predetermined amount of reflected light is received in the light transmission/reception port 242, the rotary motor 250 is continuously driven. However, if the infrared ray emitted from the light transmission/reception port 242 is not reflected from the reflection plate 243 and thus no more than a predetermined amount of reflected light is received in the light transmission/reception port 242, the light transmission/reception port 242 transmits the first signal to the cradle control section 210 and the cradle control section 210 stops the driving of the rotary motor 250 with a third control signal. As a result, the locking member 241 stops rotating and the portable terminal 100 and the cradle 200 are locked with each other.

Figure 5A:
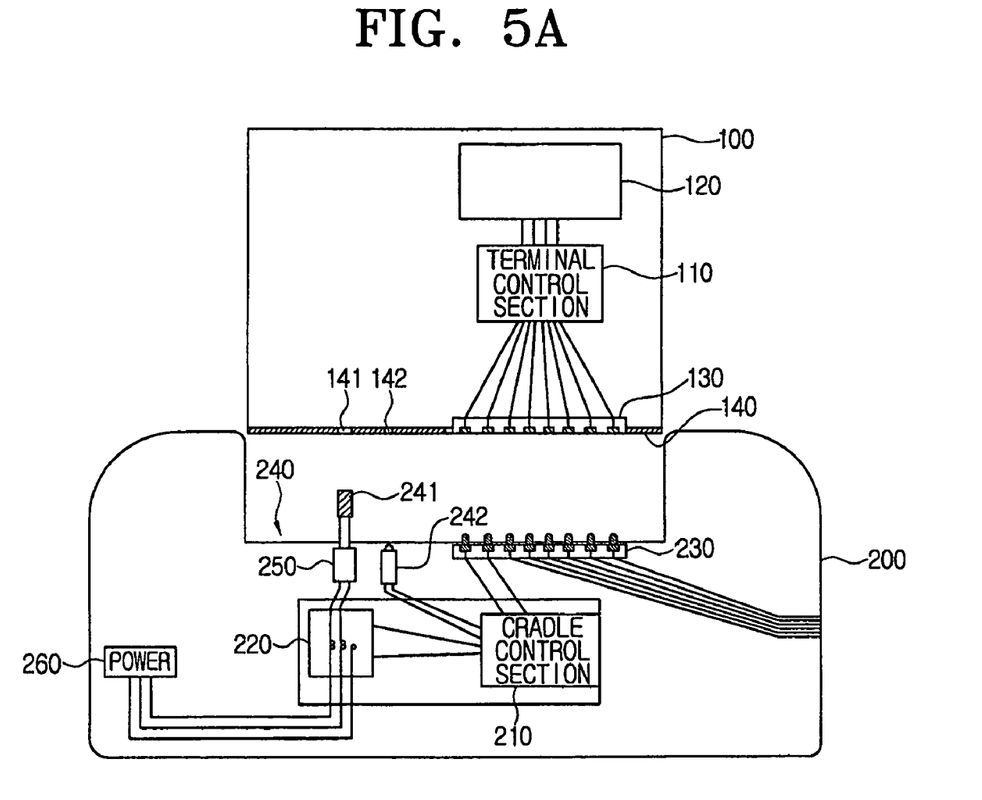
FIG. 5A is a cross-sectional view of the portable terminal and the cradle of FIG. 4a in the locking release state.

FIG. 5A is a cross-sectional view of the state in which the locking between the portable terminal and the cradle is released, according to an embodiment of the present invention.

The second recognition signal of the terminal control section 110 is transferred to the cradle control section 210 by the second locking member rotation information created in response to the input of a correct password into an input device, i.e. the display screen 120. The first and second control signals are then outputted to the rotary motor 250 and the light transmission/reception port 242, respectively, from the cradle control section 210, whereby the locking member 241 is rotated and concurrently infrared lay is emitted to determine the time for stopping the rotation of the locking member 241.

Figure 5B:
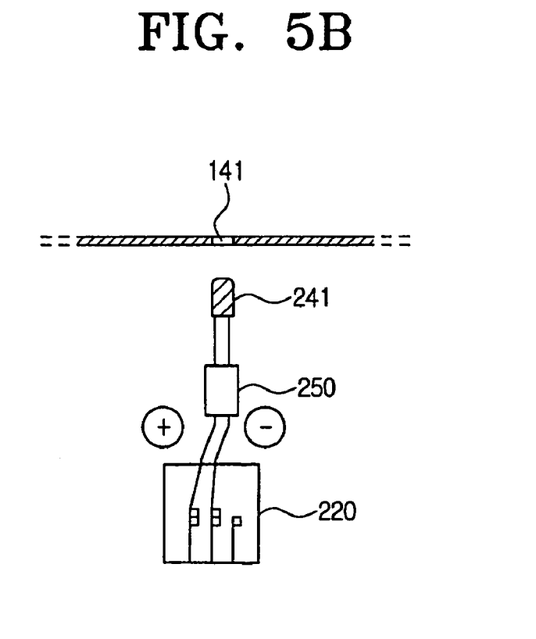
FIG. 5B is an enlarged view of a portion of FIG. 5a, illustrating the released state and the polarity-switching terminal.

FIG. 5B is an enlarged view of a part of FIG. 5A. If the infrared ray emitted from the light transmission/reception port 242 is not reflected from the reflection plate 243, and thus no more than a predetermined amount of reflected light is received in the light transmission/reception port 242, the rotary motor 250 is continuously driven. However, if the infrared ray is reflected from the reflection plate 243, and thus more than a predetermined amount of reflected light is received in the light transmission/reception port 242, the light transmission/reception port 242 transmits the second signal to the cradle control section 210 and the cradle control section 210 stops the driving of the rotary motor 250 with a fourth control signal. As a result, the locking member 241 stops rotating, and the locking between the portable terminal 100 and the cradle 200 is released.

The polarity-switching terminal 220, which was not described with reference to FIGS. 4A to 5B, is now described in detail.

As described above, when the first control signal is inputted into the polarity switching terminal 220, the polarity switching terminal 220 switches the polarities of the power supply of the rotary motor 250, and the rotary motor 250 rotates in a given direction. As a result, the locking member 241 also rotates in the given direction, whereby the portable terminal 100 and the cradle 200 will be locked each other.

When the second control signal is inputted into the polarity switching terminal 220, the polarity switching terminal 220 switches the polarities of the power supply of the rotary motor 250. and the rotary motor 250 rotates in the direction opposite to the given direction above. As a result, the locking member 241 also rotates in the opposite direction and the locking between the portable terminal 100 and the cradle 200 is released.

Figure 6:
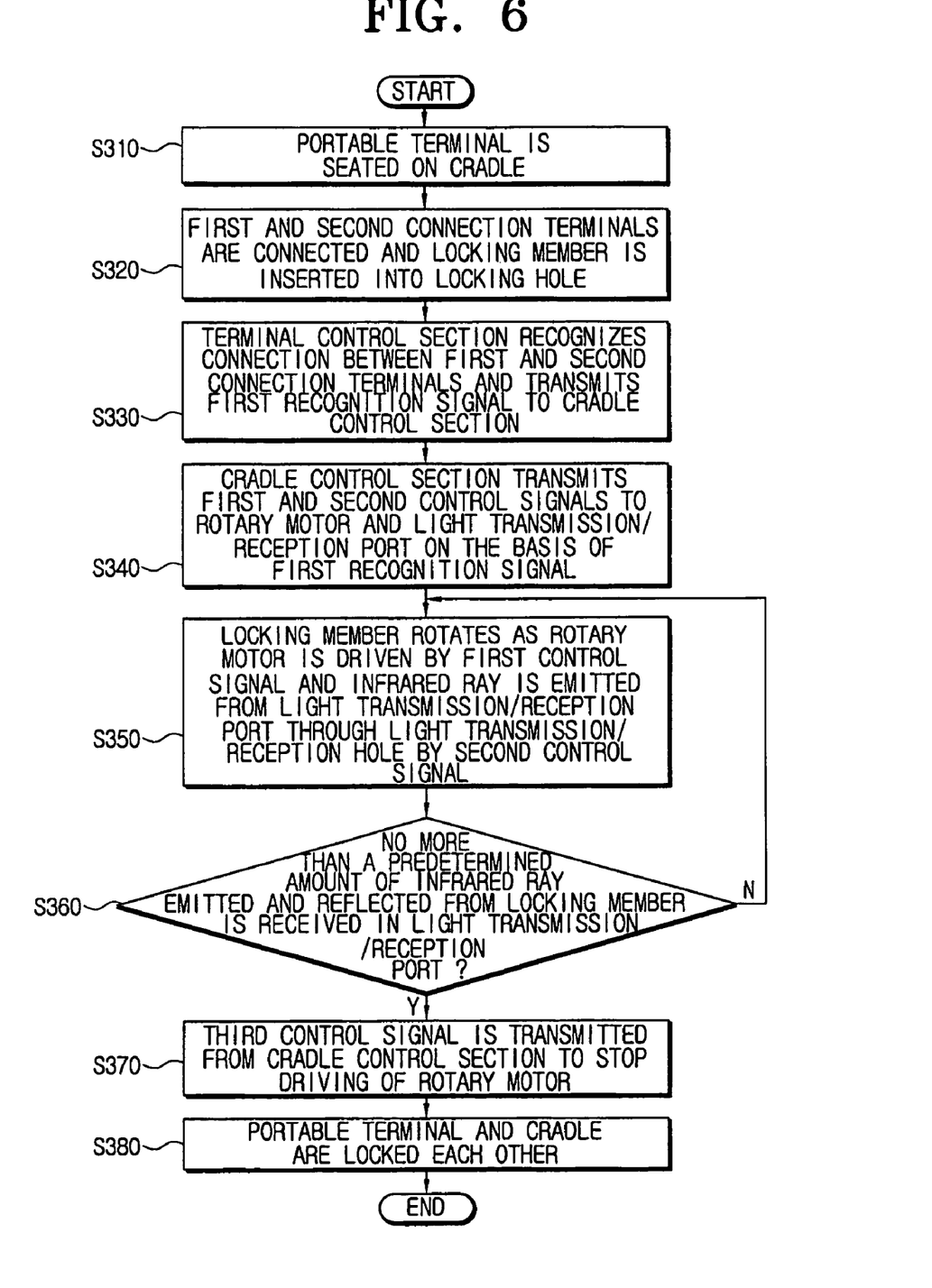
FIG. 6 is a flowchart of the locking process in the locking method according to an embodiment of the present invention.
Figure 7:
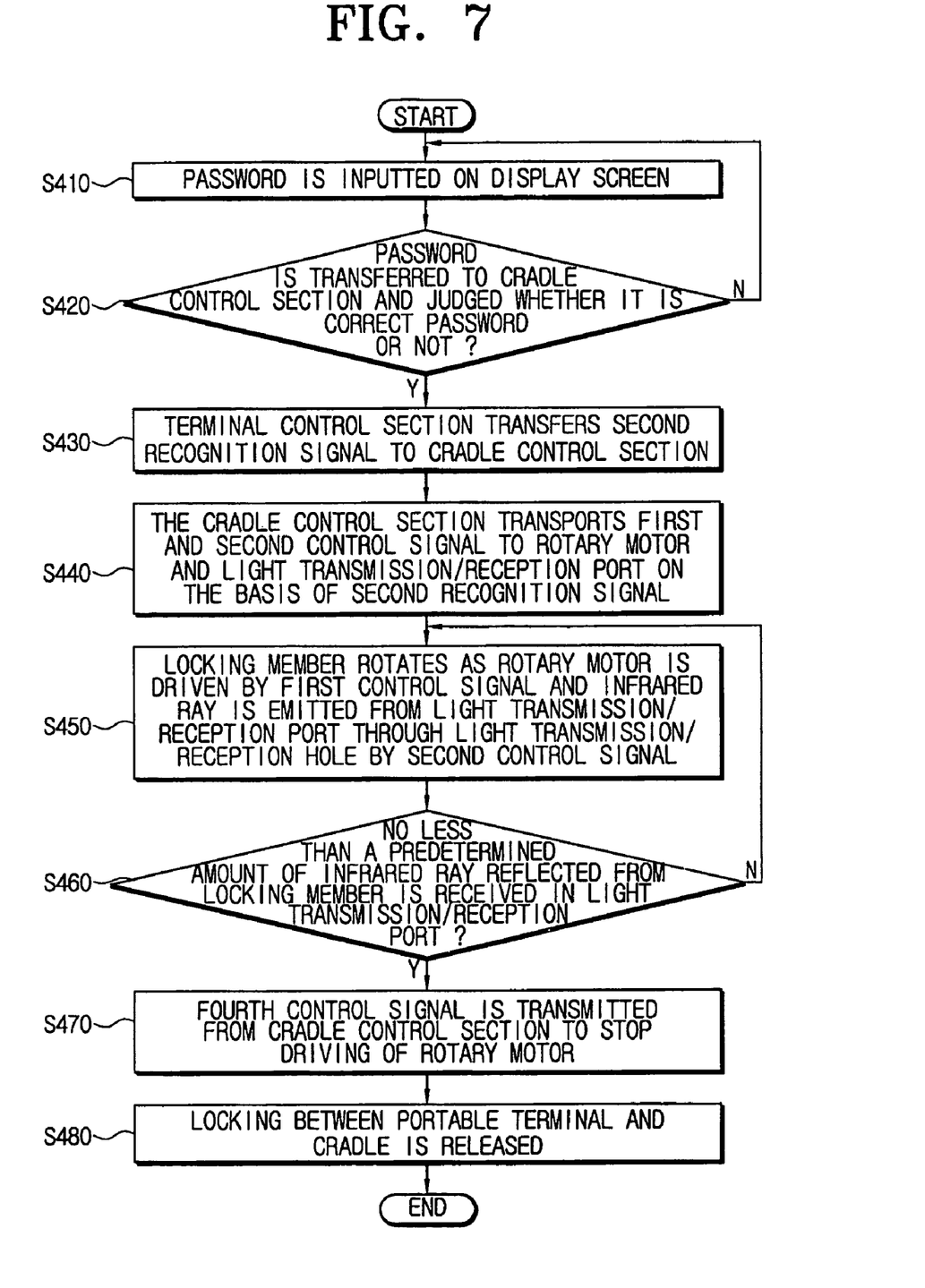
FIG. 7 is a flowchart of the locking release process in the locking method according to an embodiment of the present invention.

FIG. 6 is a flowchart of the locking process in the locking method according to an embodiment of the present invention. FIG. 7 is a flowchart of the locking release process in the locking method according to an embodiment of the present invention.

In operation S310, the portable terminal 100 is seated on the seating portion in the cradle 200 in order to interlock the portable terminal 100 and the cradle 200. As a result, in operation S320, the first and second connection terminals 130 and 230 are connected with each other and the locking member 241 is inserted into the locking hole 141. As a result, the first and second control section connection terminals 132 and 232 are interconnected. In operation S330, the terminal control section 110 recognizes this interconnection and transmits the first recognition signal to the cradle control section 210.

In operation S340, the cradle control section 210 receives the first recognition signal and transmits the first control signal to the rotary motor 250 to drive the rotary motor 250, and concurrently, in operation S350, the cradle control section 210 transmits the second control signal to the light transmission/reception port 242 to emit infrared ray.

In operation S360, the light transmission/reception port 242 determines whether the emitted infrared ray is reflected from the reflection plate 242 in the locking member 241 and received in the light transmission/reception port 242. If more than a predetermined amount of the reflected infrared ray is received in the light transmission/reception port 242, the rotary motor 250 is continuously driven, as a result of which the locking member 241 is also rotated. However, if it is judged that no more than a predetermined amount of the reflected infrared ray is received in the light transmission/reception port 242, then the rotary motor 250 stops driving. In operation S370, if the infrared ray is not fully received in the light transmission/reception port 242, the light transmission/reception port 242 sends the first signal to the cradle control section 210, and the cradle control section 210 then transmits the third control signal to the rotary motor 250 to stop the driving of the rotary motor 250. As a result, in operation S380, the locking member 241 is locked with the locking hole 141, whereby the portable terminal 100 and the cradle 200 are locked together.

In operation S410, if a user desires to release the locking between the portable terminal 100 and the cradle 200, the user may input a password into the display screen 120 that corresponds to an input device. In operation S420, the password is transferred to the terminal control section 110 and it is determined whether it is the correct password designated by the user. If it is judged that the password is correct, the terminal control section 110 recognizes this and transmits the second recognition signal to the cradle control section 210.

In operation S440, the cradle control section 210 receives the second recognition signal and transmits the first control signal to the rotary motor 250, whereby the rotary motor 250 is driven. Concurrently, in operation S450, the cradle control section transmits the second control signal to the light transmission/reception port 242, and the infrared ray is emitted from the light transmission/reception port 242.

Then, in operation S460, the light transmission/reception port 242 determines whether the emitted infrared is reflected from the reflection plate 243 in the locking member 241 and more than a predetermined amount of reflected infrared ray is received in the light transmission/reception port 242. If it is determined that no more than a predetermined amount of reflected ray is received in the light transmission/reception port 242, the rotary motor 250 continuously rotates. If more than a predetermined amount of reflected infrared ray is received in the light transmission/reception port 242, then, in operation S470, the light transmission/reception port 242 sends the second signal to the cradle control section 210 and the cradle control section 210 transmits again the fourth control signal to the rotary motor 250, thereby stopping the driving of the rotary motor 250. As a result in operation S480, the locking member 241 is released from the locking state, and the locking between the portable terminal 100 and the cradle 200 is also released.

According to the cradle design of present invention, it is possible to prevent the portable terminal from being stolen and prevent the portable terminal from being maliciously used by others. In addition, if the cradle is installed within an automobile, it is possible to prevent the portable terminal from being separated from the cradle when the automobile is shocked and/or vibrated.

Although a few embodiments of the present invention has been shown and described, it would be appreciated by those skilled in the art that changes may be made in this embodiment without departing from the principles and of the invention, the scope of which is defined in the claims and their equivalents spirit.

What is claimed is:

1. A locking apparatus comprising:
    a portable terminal having a terminal control section and a bottom plate, wherein the bottom plate includes a first connection terminal connected to the terminal control section and a locking hole;
    a cradle having a seating portion, on which the portable terminal is seated, a cradle control section, a second connection terminal located in a position corresponding to the first connection terminal and connected to the cradle control section;
    a locking member located in the seating portion in a position corresponding to the locking hole;
    a rotary motor controlled through the cradle control section and connected to the locking member, the rotary motor being rotated when a recognition signal for the locking member rotation information is inputted into the cradle control section; and
    a light transmission/reception hole located in a predetermined area in the bottom plate of the portable terminal;
    a light transmission/reception port emitting light, wherein the light transmission/reception port is located on the cradle and positioned such that emitted light is reflected from the locking member through the light transmission/reception hole; and
    a reflection plate reflecting the light to the bottom surface of the locking member, wherein the reflection plate is located on the cradle, and when a predetermined amount of light reflected from the reflection plate is received in the light transmission/reception port, the rotary motor control signal is produced in the cradle control section based upon the amount of reflected light,
    wherein the locking member is inserted into the locking hole and rotates based on locking member rotation information, the locking member rotation information being created in response to the first and second connection terminals being connected together after the portable terminal is seated on the seating portion and a request is made that the locking member and the locking hole be locked together.

2. The locking apparatus according to claim 1, wherein the bottom plate comprises at least one additional locking hole and the seating portion comprises at least one additional corresponding locking member.

3. The locking apparatus according to claim 1, wherein the portable terminal further comprises an input part to allow a password to be inputted by a user to release the connection between the locking member and the locking hole, wherein the locking member rotation information is created in response to the inputted password.

4. The locking apparatus according to claim 1, wherein the cradle further comprises a rotary motor controlled through the cradle control section and connected to the locking member, wherein the rotary motor is rotated when a recognition signal for the locking member rotation information is inputted into the cradle control section.

5. The locking apparatus according to claim 4, wherein the first connection terminal comprises a first control section connection terminal that is connected to the terminal control section, the second connection terminal comprises a second control section connection terminal that corresponds to the first control section connection terminal and is connected to the cradle control section, and the recognition signal is transmitted from the terminal control section to the cradle control section through the first and second control section connection terminals when the first and second control section connection terminals are connected together.

6. The locking apparatus according to claim 4, wherein the first connection terminal comprises a first control section connection terminal that is connected to the terminal control section, the second connection terminal comprises a second control section connection terminal that corresponds to the first control section connection terminal and connected to the cradle control section, and the recognition signal is transmitted from the terminal control section to the cradle control section through the first and second control section connection terminals when a password is inputted into an input part.

7. The locking apparatus according to claim 5, wherein the rotary motor is controlled to stop the rotation of the locking member when a rotary motor control signal is inputted through the cradle control section.

8. The locking apparatus according to claim 7, wherein the locking member rotation information is created in response to the connection of the first and second connection terminals when the amount of light reflected from the reflection plate does not exceed the predetermined amount of light.

9. The locking apparatus according to claim 7, wherein the locking member rotation information is created in response to the password inputted through the input part when the amount of light reflected from the reflection plate exceeds the predetermined amount of light.

10. The locking apparatus according to claim 4, wherein:
the cradle further comprises a polarity switching terminal connected to the rotary motor, for switching polarities of the electric power applied to the rotary motor, the polarity switching terminal being controlled through the cradle control section; and
the polarity switching terminal switches the polarities such that the rotary motor rotates in a given direction when a recognition signal for recognizing the connection of the first and second connection terminals is inputted through the cradle control section, and the rotary motor rotates in a direction opposite to the given direction when a recognition signal for recognizing the inputting of the password is inputted.

11. A locking method based on a portable terminal and a cradle, wherein the portable terminal comprises a terminal control section, a first connection terminal provided on a side of a bottom plate and connected to the terminal control section, and a locking hole formed in the other side of the bottom plate, and the cradle comprises a seating portion on which the portable terminal is seated, a cradle control section, a second connection terminal located in a position corresponding to the first connection terminal and connected to the cradle control section, a locking member located in the seating portion in a position corresponding to the locking hole, and a rotary motor connected to the locking member to rotate the locking member wherein the locking method comprises:
creating locking member rotation information that is rotation request information of the locking member;
transmitting a recognition signal, in which the terminal control section recognizes the locking member rotation information and transmits the recognition signal to the cradle control section;
outputting a control signal for controlling the rotary motor, in which the cradle control section outputs the control signal based upon the recognition signal;
driving the rotary motor according to the control signal, to rotate the locking member; and
emitting light to the locking member so that the driving of the rotary motor is stopped depending on the reflected amount of the emitted light.

12. The locking method according to claim 11, wherein upon a request that the locking member and the locking hole be locked each other, the locking member rotation information is created in response to the connection of the first and second connection terminals after the portable terminal is seated on the seating portion.

13. The locking method according to claim 11, wherein upon a request that the locking between the locking member and the locking hole be released, the locking member rotation information is created in response to a password inputted through an input part connected to the terminal control section, the input part being provided in the portable terminal.

14. The locking method according to claim 11, wherein when it is requested that the locking between the locking member and the locking hole be released, the amount of reflected light from the reflection plate does not exceed exceeds the predetermined amount of light.

15. An apparatus for locking together a portable terminal device and a cradle device, one of which has at least one locking hole, wherein the apparatus comprises:
at least one connection unit to connect the portable terminal to the cradle device;
a locking unit having at least one locking member to rotate to lock and unlock together the portable terminal device and the cradle device based upon at least locking member rotation information, wherein the locking member is positioned corresponding to the at least one locking hole; and
a light transmission/reception device to emit a light to the locking member and to transmit a signal to control the rotation of the at least one locking member.

16. The locking apparatus 15, wherein the locking unit further comprises a rotary motor located in the cradle device to control the rotation of the at least one locking member.

17. The locking apparatus of claim 16, wherein the portable terminal device further comprises an input part to allow a user to input a password to release the connection between the locking member and the locking hole, wherein the locking member rotation information is created in response to the inputted password.

18. The locking apparatus of claim 15, wherein the light transmission/reception device is located in a position corresponding to a reflection plate located on the at least one locking member.

19. The locking apparatus of claim 18, wherein the light transmission/reception device comprises:
a port located on the cradle device to emit light; and
a hole located on the portable terminal device to receive light from the port and to transmit the light into the interior of the portable terminal;
wherein the hole is positioned to correspond to the port.

20. The locking apparatus of claim 19, wherein the light is an infrared ray.

21. The locking apparatus of claim 19, wherein the reflection plate is positioned to reflect the emitted light from the at least one locking member through the hole and into the port in order to control the rotation of the rotary motor based on the amount of reflected light.

22. The locking apparatus of claim 21, wherein if the light emitted from the at least one locking member to the light transmission/reception port is more than a predetermined amount of reflected light, the rotary motor is continuously driven.

23. The locking apparatus of claim 21, wherein if the light emitted from the at least one locking member to the light transmission/reception port is not more than a predetermined amount of reflected light, the light transmission/reception port operates to transmit a signal to the cradle control section to stop the driving of the rotary motor.

24. The locking apparatus of claim 15, wherein the at least one connection unit comprises a plurality of connection terminals, including:
   first and second connection terminals located respectively on the terminal device and the cradle device, wherein the first and the second connection terminals are connectable to each other and respectively transmit data information and signals between the terminal device and the cradle device.

25. The locking apparatus of claim 24, wherein one of the plurality of connection terminals transmits and receives data information and a signal to an exterior device.

26. The locking apparatus of claim 25, wherein the exterior device is a computer.

27. The locking unit of claim 25, wherein the exterior device is a power source.

28. The locking apparatus of claim 24, wherein a signal is transmitted from the terminal control section to the cradle control section in response to the connection of the first and second control section connection terminals.

29. The locking apparatus of claim 24, wherein a signal is transmitted from the terminal control section to the cradle control section in response to a password inputted into an input part.

30. The locking apparatus of claim 16, wherein the cradle device further comprises a polarity switching unit to switch a polarity of electric power applied to the rotary motor.

31. The locking apparatus of claim 30, wherein when a first control signal is inputted into the polarity switching unit, the polarity switching unit switches the polarity of the electric power to rotate the rotary motor in a first direction in order to connect together the portable terminal device and the cradle device.

32. The locking apparatus of claim 31, wherein when a second control signal is inputted into the polarity switching unit, the polarity switching unit switches the polarity of the electric power to rotate the rotary motor in a second direction that is opposite of the first direction in order to release the connection between the portable terminal device and the cradle device.

33. The locking apparatus of claim 15, wherein the at least one locking member is a "1" shape and the locking hole is a bore shape.

* * * * *

UNITED STATES PATENT AND TRADEMARK OFFICE
CERTIFICATE OF CORRECTION

PATENT NO. : 7,130,188 B2 Page 1 of 1
APPLICATION NO. : 10/756384
DATED : October 31, 2006
INVENTOR(S) : Kwang-youb Lee

It is certified that error appears in the above-identified patent and that said Letters Patent is hereby corrected as shown below:

Column 12, Line 26, delete "exceeds" before "the".

Column 12, Line 41, change "15," to --of claim 15,--.

Signed and Sealed this

Sixth Day of March, 2007

JON W. DUDAS
*Director of the United States Patent and Trademark Office*